United States Patent
Tsubata

(10) Patent No.: US 11,296,146 B2
(45) Date of Patent: Apr. 5, 2022

(54) MAGNETORESISTIVE MEMORY DEVICE AND METHOD OF MANUFACTURING MAGNETORESISTIVE MEMORY DEVICE

(71) Applicant: KIOXIA CORPORATION, Tokyo (JP)

(72) Inventor: Shuichi Tsubata, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 93 days.

(21) Appl. No.: 16/816,398

(22) Filed: Mar. 12, 2020

(65) Prior Publication Data

US 2021/0074762 A1  Mar. 11, 2021

(30) Foreign Application Priority Data

Sep. 10, 2019 (JP) .............................. JP2019-164886

(51) Int. Cl.
| | |
|---|---|
| *H01L 27/22* | (2006.01) |
| *H01L 43/02* | (2006.01) |
| *G11C 11/16* | (2006.01) |
| *H01L 43/12* | (2006.01) |
| *H01L 43/10* | (2006.01) |

(52) U.S. Cl.
CPC .......... *H01L 27/228* (2013.01); *G11C 11/161* (2013.01); *G11C 11/1659* (2013.01); *H01L 43/02* (2013.01); *H01L 43/10* (2013.01); *H01L 43/12* (2013.01)

(58) Field of Classification Search
CPC ....... H01L 27/228; H01L 43/02; H01L 43/10; H01L 43/12; G11C 11/161
See application file for complete search history.

(56) References Cited

U.S. PATENT DOCUMENTS

| | | | |
|---|---|---|---|
| 8,828,742 B2 * | 9/2014 | Iba | .......................... H01L 43/08 438/3 |
| 9,042,166 B2 | 5/2015 | Toko et al. | |
| 9,093,632 B2 | 7/2015 | Tsubata et al. | |

(Continued)

FOREIGN PATENT DOCUMENTS

| | | |
|---|---|---|
| JP | 5865858 B2 | 3/2013 |
| JP | 2013065756 A | 4/2013 |
| JP | 2018078257 A | 5/2018 |

OTHER PUBLICATIONS

U.S. Appl. No. 16/565,316; First Named Inventor: Shuichi Tsubata; Title: "Magnetoresistive Memory Device", filed Sep. 9, 2019.

*Primary Examiner* — Shih Tsun A Chou
(74) *Attorney, Agent, or Firm* — Holtz, Holtz & Volek PC

(57) ABSTRACT

According to an embodiment, a magnetoresistive memory device includes a first conductor with a first surface. A first structure on the first surface of the first conductor includes a first ferromagnetic layer. An insulating layer is on the first structure. A second structure on the insulating layer includes a second ferromagnetic layer. A second conductor is in contact with the first surface of the first conductor and a side surface of the first structure. A first insulator on the second conductor covers a side surface of the insulating layer, and is in contact with the side surface of the first structure and a side surface of the second structure. A third conductor on the first insulator is in contact with the side surface of the second structure.

9 Claims, 16 Drawing Sheets

(56) References Cited

U.S. PATENT DOCUMENTS

| | | | |
|---|---|---|---|
| 2014/0087485 A1* | 3/2014 | Tomioka | H01L 43/12 438/3 |
| 2015/0295170 A1 | 10/2015 | Tsubata et al. | |
| 2016/0072055 A1 | 3/2016 | Seto et al. | |
| 2018/0138237 A1 | 5/2018 | Yakabe et al. | |

* cited by examiner

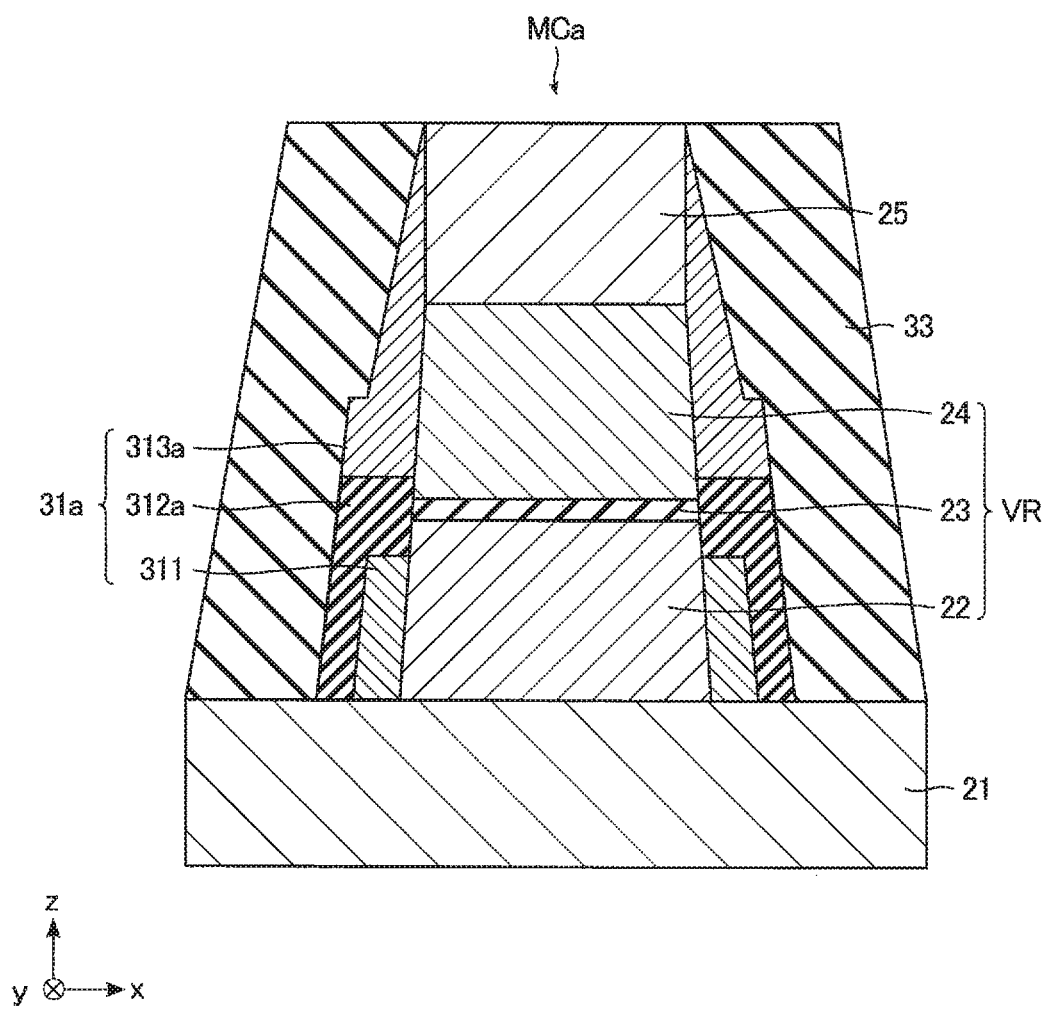
F I G. 9

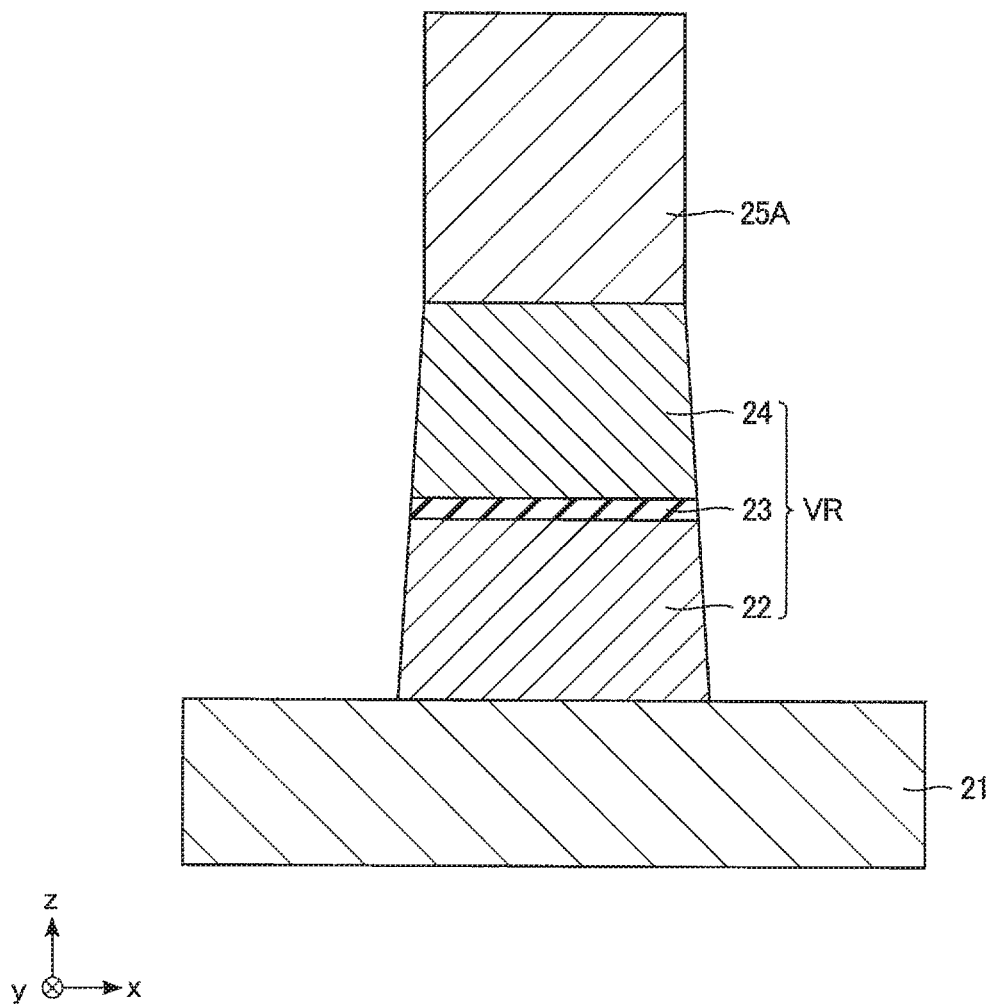
F I G. 10

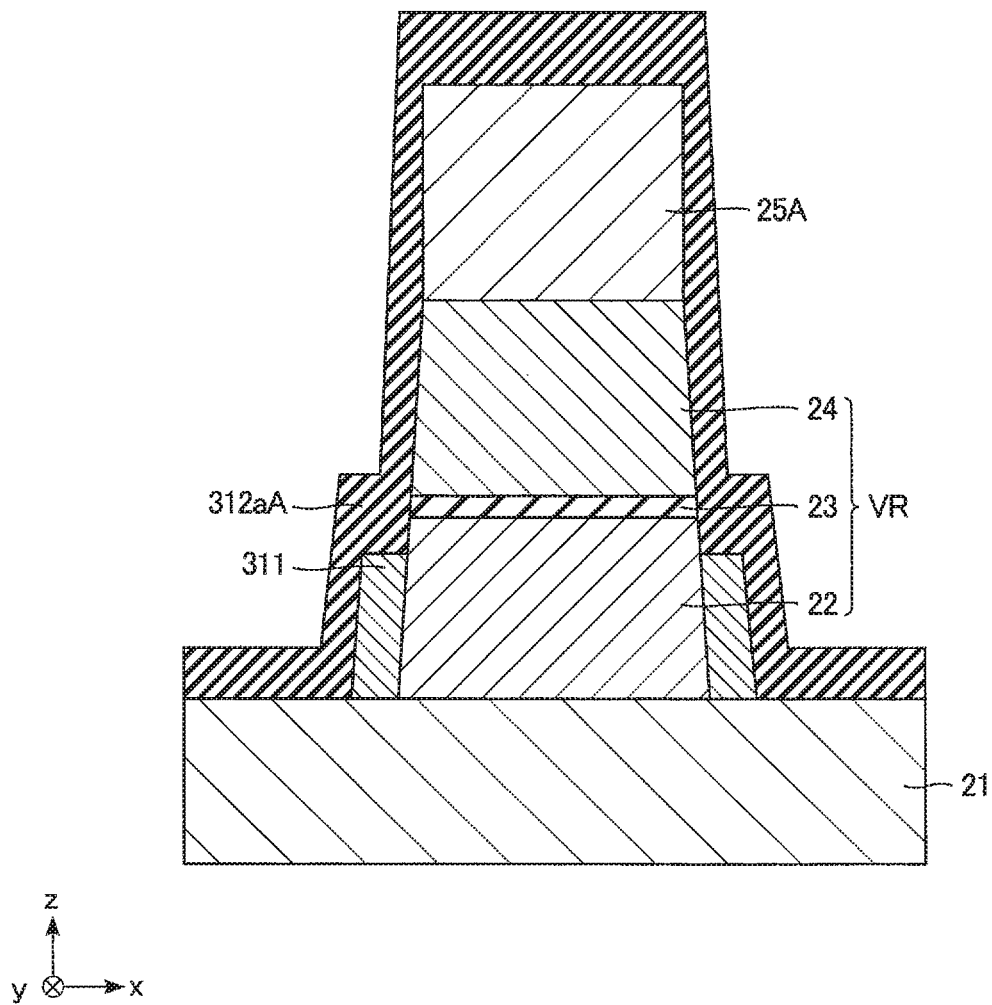
F I G. 13

MAGNETORESISTIVE MEMORY DEVICE AND METHOD OF MANUFACTURING MAGNETORESISTIVE MEMORY DEVICE

CROSS-REFERENCE TO RELATED APPLICATIONS

This application is based upon and claims the benefit of priority from Japanese Patent Application No. 2019-164886 filed Sep. 10, 2019, the entire contents of which are incorporated herein by reference.

FIELD

Embodiments described herein relate generally to a magnetoresistive memory device.

BACKGROUND

Magnetoresistive memory devices capable of storing data using magneto-resistance effects are known.

BRIEF DESCRIPTION OF THE DRAWINGS

FIG. 9 shows a cross-sectional structure of part of a memory cell of a second embodiment.

FIGS. 10 to 17 sequentially show structures of part of the memory cell of the memory cell of the second embodiment during a process of manufacturing the same.

DETAILED DESCRIPTION

Figure 1:
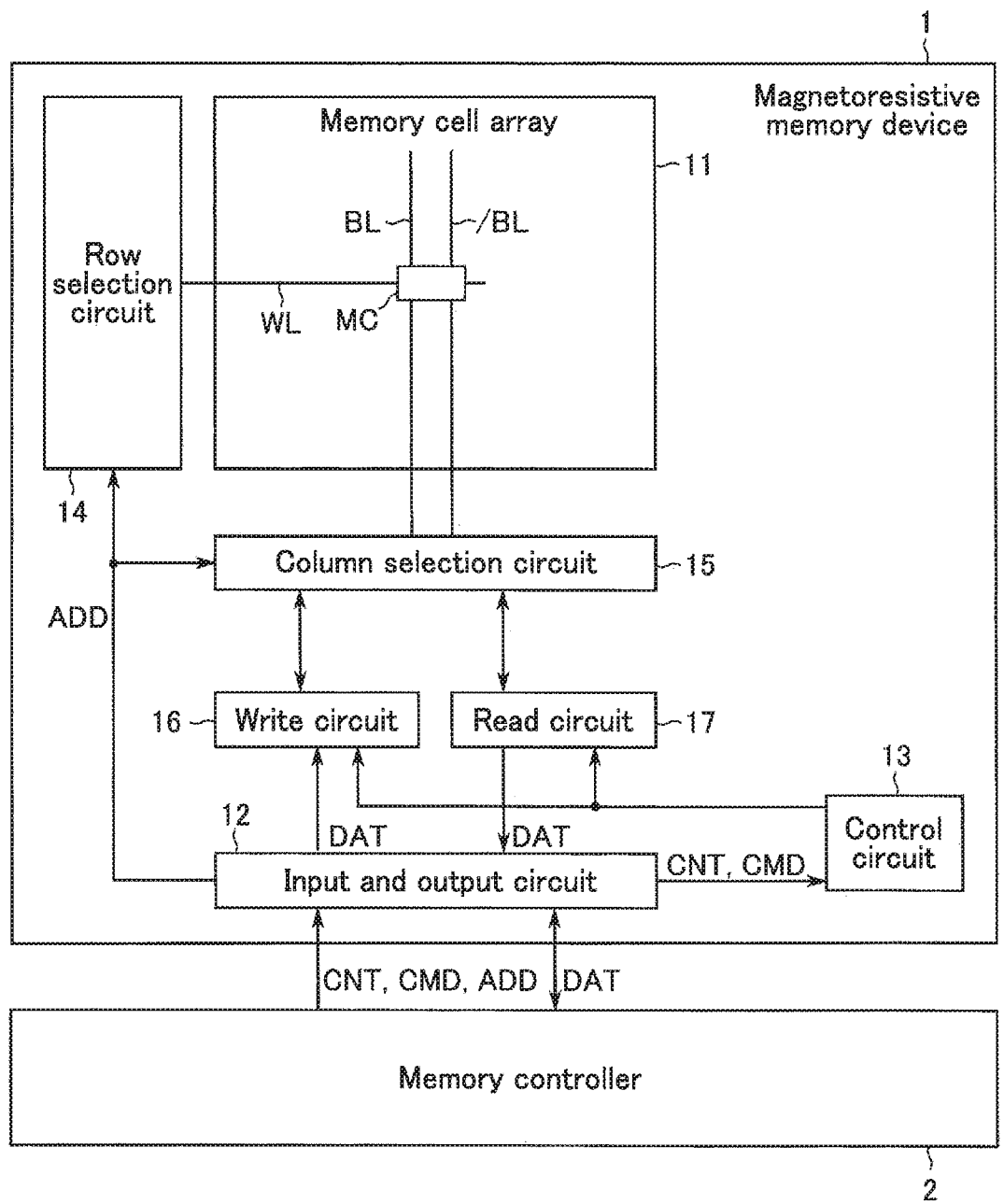
FIG. 1 shows functional blocks of the magnetoresistive memory device of a first embodiment.

In general, according to an embodiment, a magnetoresistive memory device includes a first conductor with a first surface. A first structure on the first surface of the first conductor includes a first ferromagnetic layer. An insulating layer is on the first structure. A second structure on the insulating layer includes a second ferromagnetic layer. A second conductor is in contact with the first surface of the first conductor and a side surface of the first structure. A first insulator on the second conductor covers a side surface of the insulating layer, and is in contact with the side surface of the first structure and a side surface of the second structure. A third conductor on the first insulator is in contact with the side surface of the second structure.

Embodiments will now be described with reference to the figures. In the following description, components with substantially the same functionalities and configurations will be referred to with the same reference numerals, and repeated descriptions may be omitted. The figures are schematic, and the relations between the thickness and the area of a plane of a layer and ratios of thicknesses of layers may differ from actual ones. Moreover, the figures may include components which differ in relations and/or ratios of dimensions in different figures.

Moreover, the entire description for a particular embodiment also applies to another embodiment unless explicitly mentioned otherwise or obviously eliminated. Each embodiment illustrates the device and method for materializing the technical idea of that embodiment, and the technical idea of an embodiment does not limit the quality of the material, shape, structure, arrangement of components, etc. to the following.

In the specification and the claims, a phrase of a particular first component being "coupled" to another second component includes the first component being coupled to the second component either directly or via one or more components which are always or selectively conductive.

Hereinafter, embodiments will be described using an x-y-z orthogonal coordinate system. In the description below, the term "below" as well as terms derived therefrom and terms related thereto refer to a position having a smaller coordinate on the z-axis, and the term "above" as well as terms derived therefrom and terms related thereto refer to a position having a larger coordinate on the z-axis.

First Embodiment

Structure (Configuration)

FIG. 1 shows functional blocks of the magnetoresistive memory device according to the first embodiment. As shown in FIG. 1, a magnetoresistive memory device 1 includes a memory cell array 11, an input and output circuit 12, a control circuit 13, a row selection circuit 14, a column selection circuit 15, a write circuit 16, and a read circuit 17.

The memory cell array 11 includes memory cells MC, word lines WL, bit lines BL, and bit lines /BL. One bit line BL and one bit line /BL constitute one bit line pair.

The memory cell MC can store data in a non-volatile manner. Each memory cell MC is coupled to one word line WL and a pair of bit lines BL and /BL. Each word line WL is associated with a row. Each pair of bit lines BL and /BL is associated with a column. Selection of one row and selection of one or more columns specify one or more memory cells MC.

The input and output circuit 12 receives various types of a control signal CNT, various types of a command CMD, an address signal ADD, and data (write data) DAT, for example, from a memory controller 2, and transmits data (read data) DAT to, for example, the memory controller 2.

The row selection circuit 14 receives the address signal ADD from the input and output circuit 12, and brings one word line WL associated with the row that is specified by the received address signal ADD into a selected state.

The column selection circuit 15 receives the address signal ADD from the input and output circuit 12 and brings bit lines BL associated with the column that is specified by the received address signal ADD into a selected state.

The control circuit 13 receives the control signal CNT and the command CMD from the input and output circuit 12. The control circuit 13 controls the write circuit 16 and the read circuit 17 based on control instructed by the control signal CNT and the command CMD. Specifically, the control circuit 13 supplies voltages used for data writing to the write circuit 16 during the data writing to the memory cell array 11. Further, the control circuit 13 supplies voltages used for data reading to the read circuit 17 during the reading of data from the memory cell array 11.

The write circuit 16 receives write data DAT from the input and output circuit 12 and supplies the voltages used for data writing to the column selection circuit 15 based on the control by the control circuit 13 and the write data DAT.

The read circuit 17 includes a sense amplifier, and based on the control of the control circuit 13, uses the voltages used for data reading to determine data stored in the memory cells MC. The determined data is supplied to the input and output circuit 12 as the read data DAT.

Figure 2:
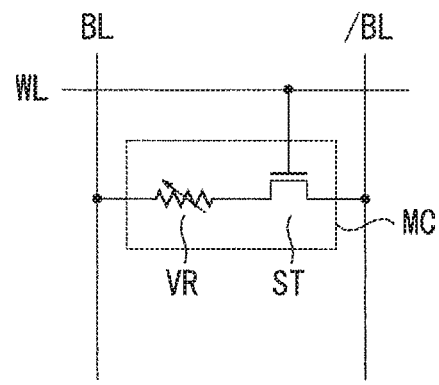
FIG. 2 is a circuit diagram of one memory cell of the first embodiment.

FIG. 2 is a circuit diagram of one memory cell MC of the first embodiment. The memory cell MC includes a magnetoresistive effect element VR and a select transistor ST. The magnetoresistive effect element VR exhibits a magnetoresistive effect, and includes, for example, a magnetic tunnel junction (MTJ) element. The MTJ element refers to a structure including an MTJ. In a steady state, the magnetoresistive effect element VR can be in a selected resistance state of two resistance states, and the resistance of one of the two resistance states is higher than the resistance of the other. The magnetoresistive effect element VR can switch between the low resistance state and the high resistance state, and can store one bit of data using the difference between the two resistance states.

The select transistor ST is, for example, an n-type metal oxide semiconductor field effect transistor (MOSFET).

The magnetoresistive effect element VR is coupled to one bit line BL at its first end, and is coupled to a first end (the source or drain) of the select transistor ST at its second end. The second end (the drain or source) of the select transistor ST is coupled to one bit line /BL. The gate of the select transistor ST is coupled to one word line WL, and the source is coupled to the bit line /BL.

Figure 3:
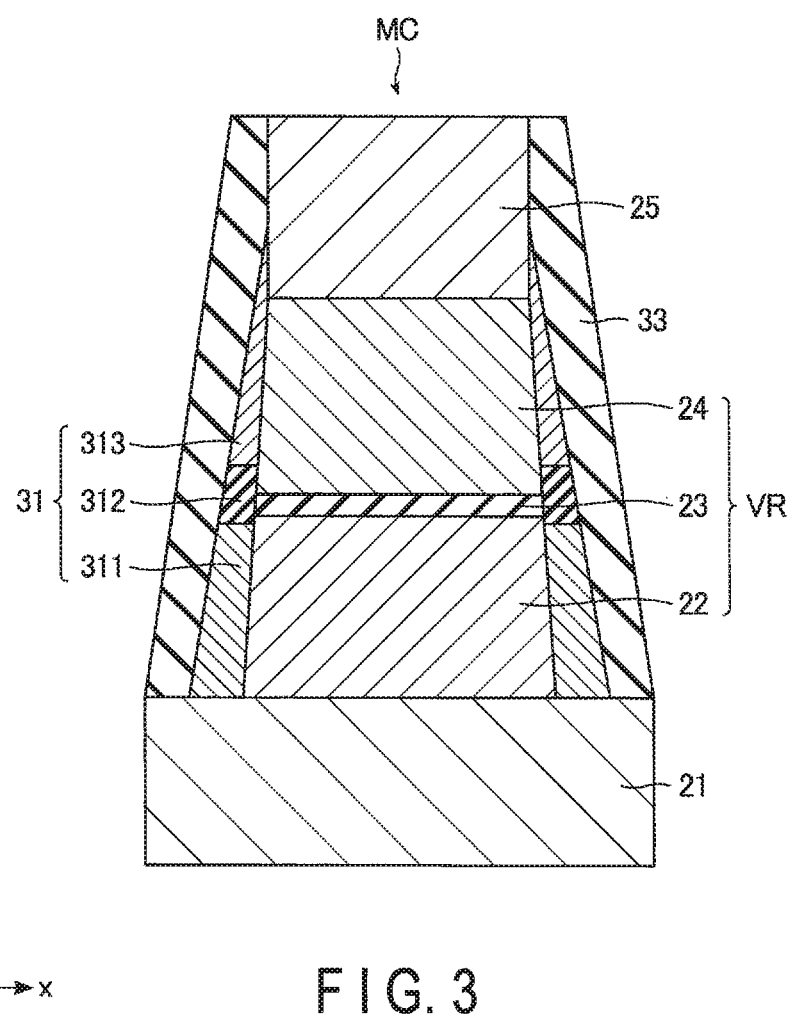
FIG. 3 shows a cross-sectional structure of part of a memory cell of the first embodiment.

FIG. 3 shows a partial cross-sectional structure of a memory cell MC of the first embodiment, and in particular, a cross-sectional structure of a magnetoresistive effect element VR and elements therearound.

As shown in FIG. 3, the memory cell MC includes a lower electrode 21. The lower electrode 21 is positioned above a semiconductor substrate (not shown), and is coupled to a select transistor ST (not shown) at its bottom surface. The lower electrode 21 includes one or more selected from copper (Cu), scandium (Sc), titanium (Ti), zirconium (Zr), hafnium (Hf), tantalum (Ta), and tungsten (W).

The magnetoresistive effect element VR is provided on the upper surface of the lower electrode 21. For example, the magnetoresistive effect element VR has a substantially circular shape along an xy plane, and has a shape of a truncated cone with an area of its upper surface smaller than an area of its bottom surface. The magnetoresistive effect element VR includes a ferromagnet (ferromagnetic layer) 22, an insulator (insulating layer) 23, and a ferromagnet (ferromagnetic layer) 24. The insulator 23 is positioned between the ferromagnet 22 and the ferromagnet 24. For example, the ferromagnet 22 is positioned at a part that includes the bottom surface of the magnetoresistive effect element VR as well as on the upper surface of the lower electrode 21; and the ferromagnet 24 is positioned at a part that includes the upper surface of the magnetoresistive effect element VR. For example, the insulator 23 is positioned on the upper surface of the ferromagnet 22, and the ferromagnet 24 is positioned on the upper surface of the insulator 23. The description and the figures referred to below are based on these examples.

The ferromagnet 22 may have a structure that includes only a single layer of ferromagnet, or a structure in which a plurality of ferromagnets and one or more conductors are stacked. The ferromagnet 22 includes one or more selected from iron (Fe), cobalt (Co), nickel (Ni), ruthenium (Ru), rhodium (Rh), palladium (Pd), Ta, iridium (Ir), platinum (Pt), magnesium (Mg), silicon (Si), aluminum (Al), Sc, yttrium (Y), Hf, W, and neodymium (Nd). The ferromagnet 22 has a magnetization easy axis along a direction passing through interfaces of the ferromagnet 22, the insulator 23, and the ferromagnet 24, and has, for example, a magnetization easy axis along a direction orthogonal to the interfaces. The magnetization direction of the ferromagnet 22 is intended to be invariable even when data read and write operations are performed at the magnetoresistive memory device 1. The ferromagnet 22 can function as a so-called reference layer.

For example, the insulator 23 includes or is made of magnesium oxide (MgO). The insulator 23 can function as a tunnel barrier.

The ferromagnet 24 may have a structure that includes only a single layer of ferromagnet, or a structure in which a plurality of ferromagnets and one or more conductors are stacked. The ferromagnet 24 includes one or more selected from Fe, Co, Ni, Ru, Rh, Pd, Ta, Ir, Pt, Mg, Si, Al, Sc, Y, Hf, W, and Nd. The ferromagnet 24 has a magnetization easy axis along a direction passing through interfaces of the ferromagnet 22, the insulator 23, and the ferromagnet 24, and has, for example, a magnetization easy axis along a direction orthogonal to the interfaces. The magnetization direction of the ferromagnet 24 can change when data is written; thus, the ferromagnet 24 can function as a so-called storage layer.

When the magnetization direction of the ferromagnet 24 is parallel to the magnetization direction of the ferromagnet 22, the magnetoresistive effect element VR has a lower resistance. When the magnetization direction of the ferromagnet 24 is antiparallel to the magnetization direction of the ferromagnet 22, the magnetoresistive effect element VR has a higher resistance.

To read data, a read current that flows through a memory cell MC from which the data is to be read is used, for example, and it is determined which of two resistance states the magnetoresistive effect element VR of the read target memory cell MC is in.

When a write current $IW_P$ having a certain magnitude flows from the ferromagnet 24 toward the ferromagnet 22, the magnetization direction of the ferromagnet 24 becomes parallel to the magnetization direction of the ferromagnet 22. On the other hand, when a write current $IW_{AP}$ flows from the ferromagnet 22 toward the ferromagnet 24, the magnetization direction of the ferromagnet 24 becomes antiparallel to the magnetization direction of the ferromagnet 22.

An upper electrode 25 is provided on the upper surface of the ferromagnet 24.

A protective film 31 is provided on the side surface of the magnetoresistive effect element VR. For example, the protective film 31 covers the side surface of the magnetoresistive effect element VR. The protective film 31 includes a conductor 311, an insulator 312, and a conductor 313.

The conductor 311 is positioned at the lowermost part of the protective film 31 that includes the bottom surface of the protective film 31. The upper surface of the conductor 311 is positioned below the upper surface of the ferromagnet 22. Namely, the conductor 311 covers a part of the side surface of the ferromagnet 22 that ranges from the position of the bottom surface to a position slightly below the upper surface. The conductor 311 includes, for example, the various elements included in the ferromagnet 22 and/or oxides of such elements. Specifically, the conductor 311 includes elements that are conductive even in an oxidized state, and more specifically includes one or more selected from Fe, Co, Ni, Cu, Ru, Rh, Pd, Ta, W, Ir, and Pt. The conductor 311 includes, for example, one or more selected from Fe, Co, Ni, Cu, Ru, Rh, Pd, Ta, W, Ir, Pt, and oxides of these elements.

The insulator 312 is positioned at the middle part of the protective film 31; for example, on the upper surface of the conductor 311. The insulator 312 covers the side surface of the insulator 23. The bottom surface of the insulator 312 is positioned below the bottom surface of the insulator 23. Namely, a lower part of the insulator 312 that includes the bottom surface of the insulator 312 is in contact with the side surface of the ferromagnet 22. The upper surface of the insulator 312 is positioned above the upper surface of the insulator 23. Namely, an upper part of the insulator 312 that includes the bottom surface of the insulator 312 is in contact with the side surface of the conductor 313. The insulator 312 includes, for example, oxides of various elements included in the components positioned below the insulator 312. Specifically, the insulator 312 includes conductive elements that become insulative when oxidized, and more specifically includes one or more selected from Mg, Al, Sc, Y, Hf, and Nd. The insulator 312 includes, for example, one or more selected from Mg, Si, Al, Sc, Y, Hf, Nd, and oxides of these elements.

The conductor 313 is positioned at the uppermost part of the protective film 31 that includes the upper surface of the protective film 31; for example, on the upper surface of the insulator 312. The upper end of the conductor 313 is positioned above the upper surface of the ferromagnet 24. Alternatively, the upper end of the conductor 313 may cover the entire side surface of the upper electrode 25. The conductor 313 includes the various elements included in the ferromagnet 24 and/or oxides of such elements. Specifically, the conductor 313 includes elements that are conductive even in an oxidized state, and more specifically includes one or more selected from Fe, Co, Ni, Cu, Ru, Rh, Pd, Ta, W, Ir, and Pt. The conductor 313 includes, for example, one or more selected from Fe, Co, Ni, Cu, Ru, Rh, Pd, Ta, W, Ir, Pt, and oxides of these elements.

The outer side surface of the protective film 31, that is, the side surface on the opposite side of the magnetoresistive effect element VR is covered with the insulator 33. The insulator 33 further covers a part of the side surface of the upper electrode 25 not covered with the conductor 313, and a part of the upper surface of the lower electrode 21 not covered with the magnetoresistive effect element VR and the conductor 311. For example, the insulator 33 includes or is made of silicon nitride.

<1.2. Manufacturing Method>

The structure shown in FIG. 3 can be manufactured by various methods. In particular, when the ferromagnet 22 and/or the ferromagnet 24 have (has) a layered structure, various methods can be used depending on the number or the type (material) of the layers included in the ferromagnet 22 and/or the ferromagnet 24. Hereinafter, a manufacturing method will be described based on an example in which the ferromagnet 22 has a layered structure, specifically a layered structure that includes a conductor (conducting layer) 221, a conductor (conducting layer) 222, and a ferromagnet (ferromagnetic layer) 223. However, the method of manufacturing the memory cell MC of the first embodiment is not limited to the example described below.

FIGS. 4 to 8 respectively show a state of a manufacturing process of a part of a structure of the memory cell MC of the first embodiment in order, showing the same portion as that shown in FIG. 3. FIGS. 4 to 8 show a manufacturing process for a more detailed example of the structure shown in FIG. 3.

Figure 4:
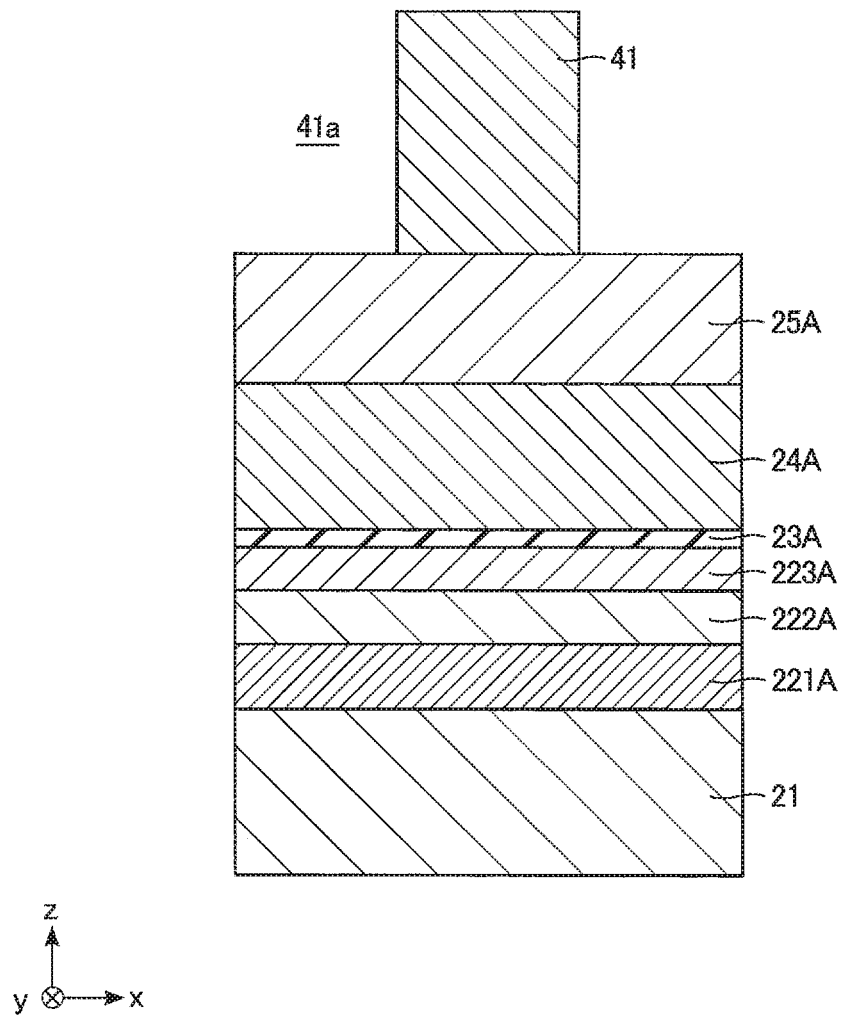
FIGS. 4 to 8 sequentially show structures of part of the memory cell of the first embodiment during a process of manufacturing the same.

As shown in FIG. 4, a conductor 221A, a conductor 222A, and a ferromagnet 223A are stacked on the upper surface of the lower electrode 21 in the mentioned order. The conductor 221A, the conductor 222A, and the ferromagnet 223A are layers formed into the conductor 221, the conductor 222, and the ferromagnet 223, respectively, in the subsequent steps. The conductor 221A, the conductor 222A, and the ferromagnet 223A include one or more materials that is/are the same as those included in the ferromagnet 22.

An insulator 23A, a ferromagnet 24A, and a conductor 25A are stacked on the ferromagnet 223A in the mentioned order. The insulator 23A, the ferromagnet 24A, and the conductor 25A are layers formed into the insulator 23, the ferromagnet 24, and the upper electrode 25, respectively, in the subsequent steps. The insulator 23A, the ferromagnet 24A, and the conductor 25A include one or more materials that is/are the same as those of the insulator 23, the ferromagnet 24, and the upper electrode 25, respectively.

A hard mask 41 is formed on the upper surface of the conductor 25A. The hard mask 41 has a pattern that remains directly above a region where the upper electrode 25 is to be formed, and includes an opening 41a that reaches the bottom surface from the upper surface in the other regions. The hard mask 41 is conductive and, for example, includes or is made of titanium nitride.

Figure 5:
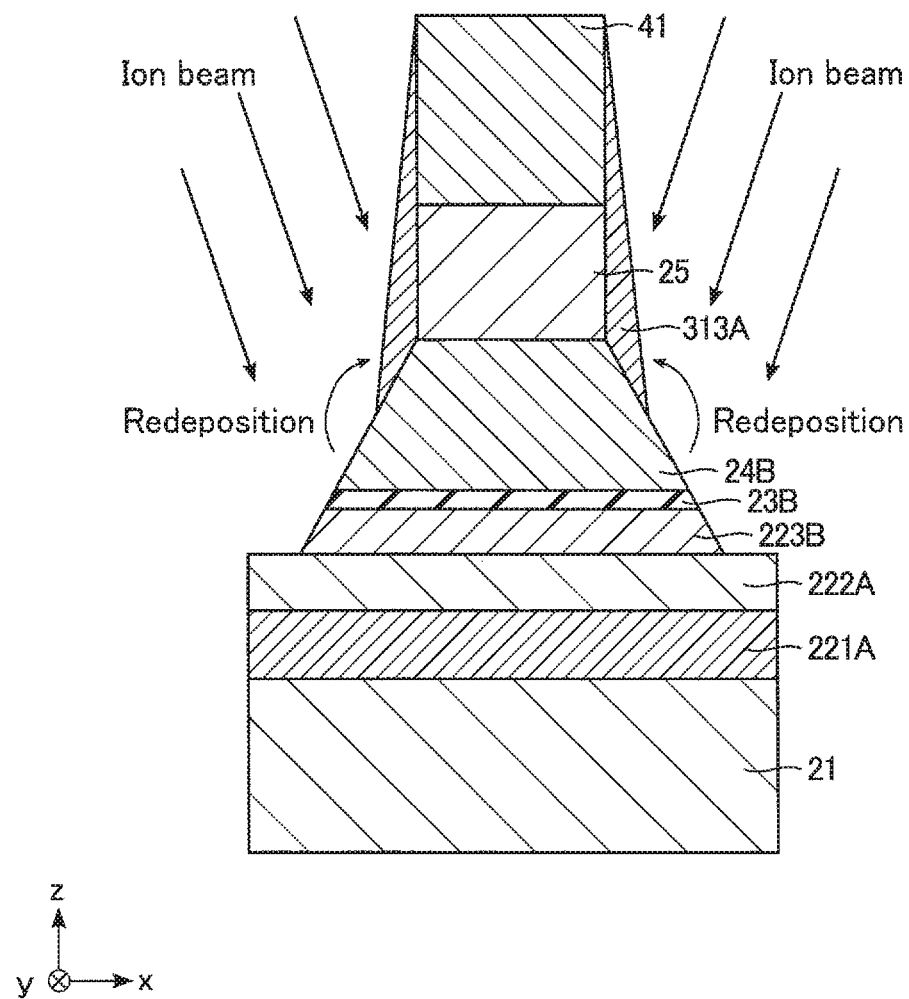

As shown in FIG. 5, the structure obtained by the process described so far is etched using an ion beam. Ion beam etching (IBE) of the embodiment may be performed using an ion of argon (Ar), xenon (Xe), krypton (Kr), or neon (Ne). The IBE shown in FIG. 5 may be referred to as a first IBE. The ion beam of the first IBE has an angle with respect to the z-axis. The ion beam proceeds through the opening 41a of the hard mask 41, and partially removes the conductor 25A, the ferromagnet 24A, the insulator 23A, and the ferromagnet 223A. The first IBE forms the conductor 25A into the upper electrode 25.

The first IBE forms the structure made of the ferromagnet 24A, the insulator 23A, and the ferromagnet 223A to be tapered on the side surface, and processes the ferromagnet 24A, the insulator 23A, and the ferromagnet 223A into the ferromagnet 24B, the insulator 23B, and the ferromagnet 223B, respectively.

The first IBE may cause a material that has been removed from an etching-target material to be redeposited on the surrounding components. Said material includes materials that have been removed from the ferromagnet 24A, the insulator 23A, and the ferromagnet 223A, and a material that has been removed from the pattern of the hard mask 41 in a structure for another memory cell MC adjacent to the structure shown in FIG. 5. A film 313A is formed by the redeposition. The film 313A will be processed into the insulator 312 in the subsequent steps, and includes one or more materials that are the same as those included in the insulator 312. The film 313A covers the side surface of the hard mask 41, the side surface of the upper electrode 25, and the upper part of the side surface of the ferromagnet 24B. The film 313A is continuous over the side surface of the hard mask 41, the side surface of the upper electrode 25, and a part of the side surface of the ferromagnet 24B, for example.

Figure 6:
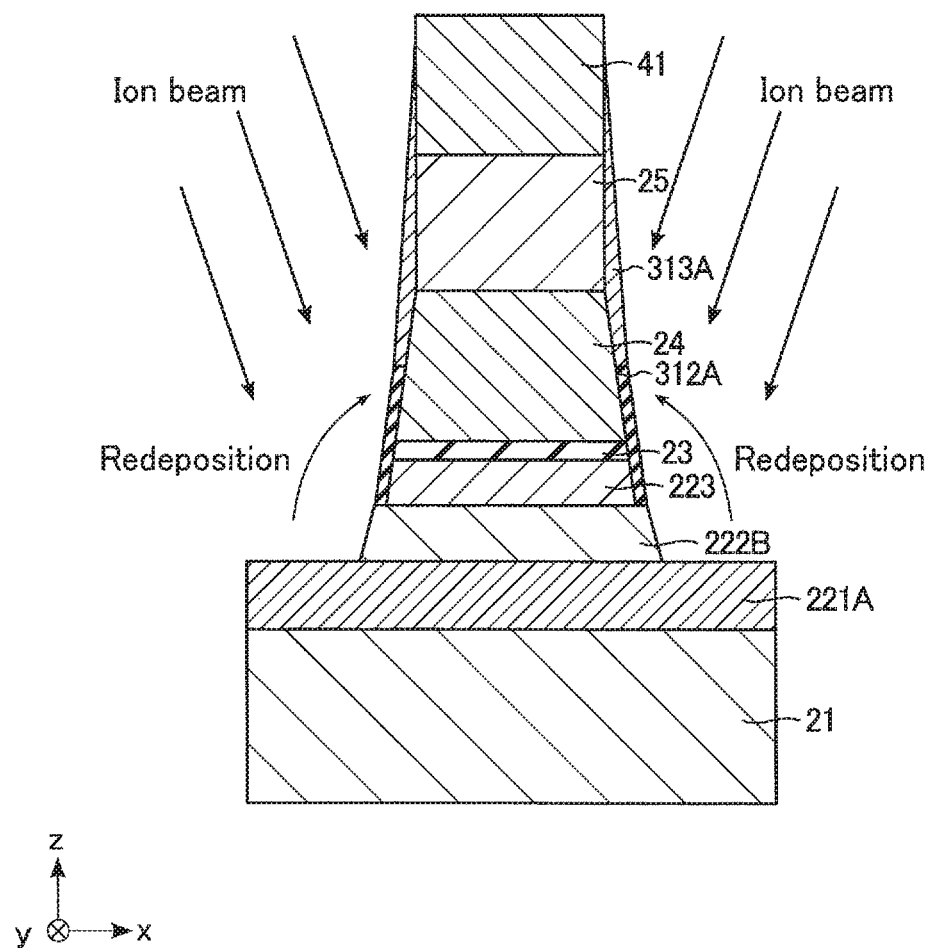

As shown in FIG. 6, the structure obtained by the process described so far is etched using an ion beam. The IBE shown in FIG. 6 may be referred to as a second IBE. The ion beam of the second IBE has an angle with respect to the z-axis. The angle of the ion beam of the second IBE with respect to the z-axis may be different from the angle of the ion beam of the first IBE with respect to the z-axis. The ion beam proceeds through the opening 41a of the hard mask 41, and partially removes the ferromagnet 24B, the insulator 23B, the ferromagnet 223B, and the conductor 222A. The second IBE forms the ferromagnet 24B, the insulator 23B, the ferromagnet 223B, and the conductor 222A into the ferromagnet 24, the insulator 23, the ferromagnet 223, and the conductor 222B. The second IBE partially removes the film 313A as well, so that the film 313A becomes thin.

The second IBE may cause a material that has been removed from an etching-target material to be redeposited on the surrounding components. Said material includes a material that has been removed from the conductor 222A. A film 312A is formed by the redeposition. The film 312A is processed into the insulator 312 in the subsequent step, and includes one or more materials that are the same as those included in the insulator 312. The film 312A covers the lower part of the side surface of the ferromagnet 24 that is not covered with the film 313A, the side surface of the insulator 23, and the side surface of the ferromagnet 223. The film 312A is continuous over the lower part of the side surface of the ferromagnet 24, the side surface of the insulator 23, and the side surface of the ferromagnet 223, for example.

The ion beam used in the second IBE is blocked by the film 313A. Therefore, the portion covered with the film 313A is protected from the ion beam. The protected portion includes the upper part of the side surface of the ferromagnet 24.

Figure 7:
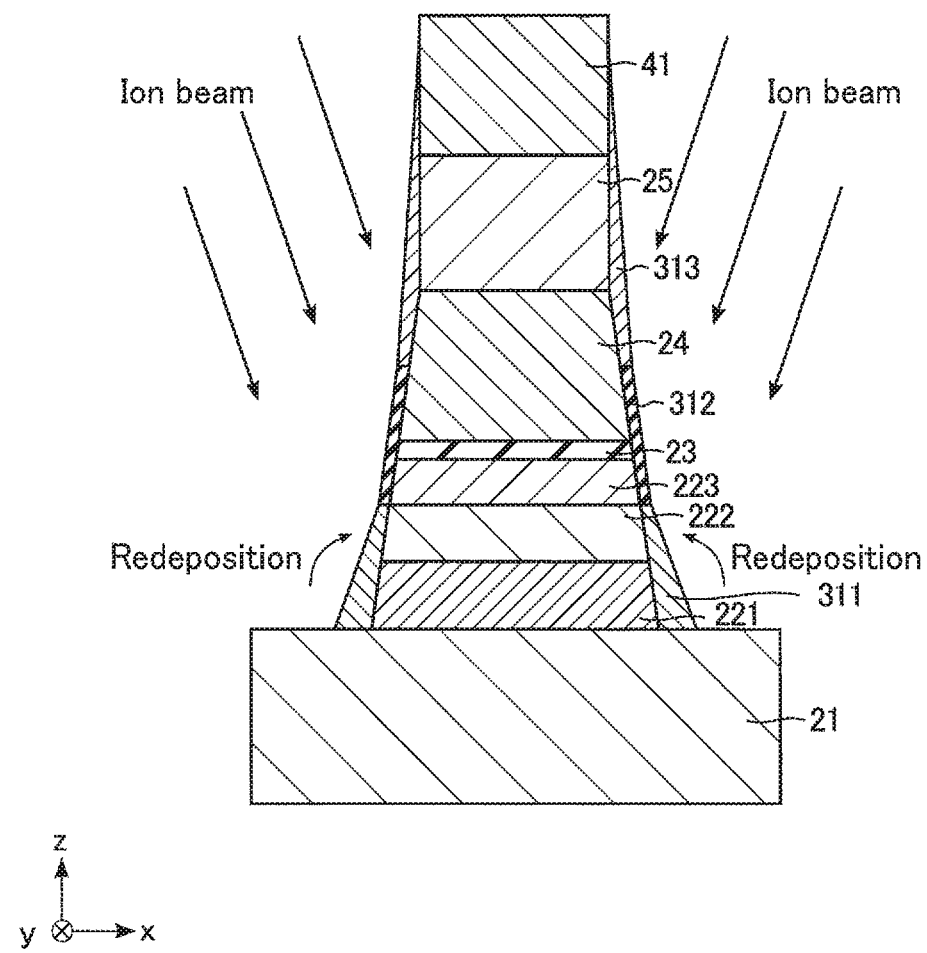

As shown in FIG. 7, the structure obtained by the process described so far is etched using an ion beam. The IBE shown in FIG. 7 may be referred to as a third IBE. The ion beam of the third IBE has an angle with respect to the z-axis. The angle of the ion beam of the third IBE with respect to the z-axis may be different from the angle of the ion beam of the first IBE with respect to the z-axis and/or the angle of the ion beam of the second IBE with respect to the z-axis. The ion beam proceeds through the opening 41a of the hard mask 41, and partially removes the conductor 221A. The third IBE forms the conductor 222B and the conductor 221A into the conductor 222 and the conductor 221, respectively. The third IBE partially removes the film 312A and the film 313A as well. As a result, the film 312A and the film 313A are formed into the conductor 313 and the insulator 312, respectively.

The third IBE may cause a material that has been removed from an etching-target material to be redeposited on the surrounding components. Said material includes a material that has been removed from the conductor 221A. The conductor 311 is formed by the redeposition. The conductor 311 covers the side surface of the conductor 222 and the side surface of the conductor 221. The conductor 311 is continuous over the side surface of the conductor 222 and the side surface of the conductor 221, for example.

The ion beam used in the third IBE is blocked by the conductor 313 and the insulator 312. Therefore, the portion covered with the conductor 313 and the insulator 312 is protected from the ion beam. The protected portion includes the lower part of the side surface of the ferromagnet 24, the side surface of the insulator 23, and the side surface of the ferromagnet 223.

Through the steps up to that shown in FIG. 7, the structure in which the side surfaces of the ferromagnet 24, the insulator 23, and the ferromagnet 22 are covered with the conductor 313, the insulator 312, and the conductor 311 is formed.

Figure 8:
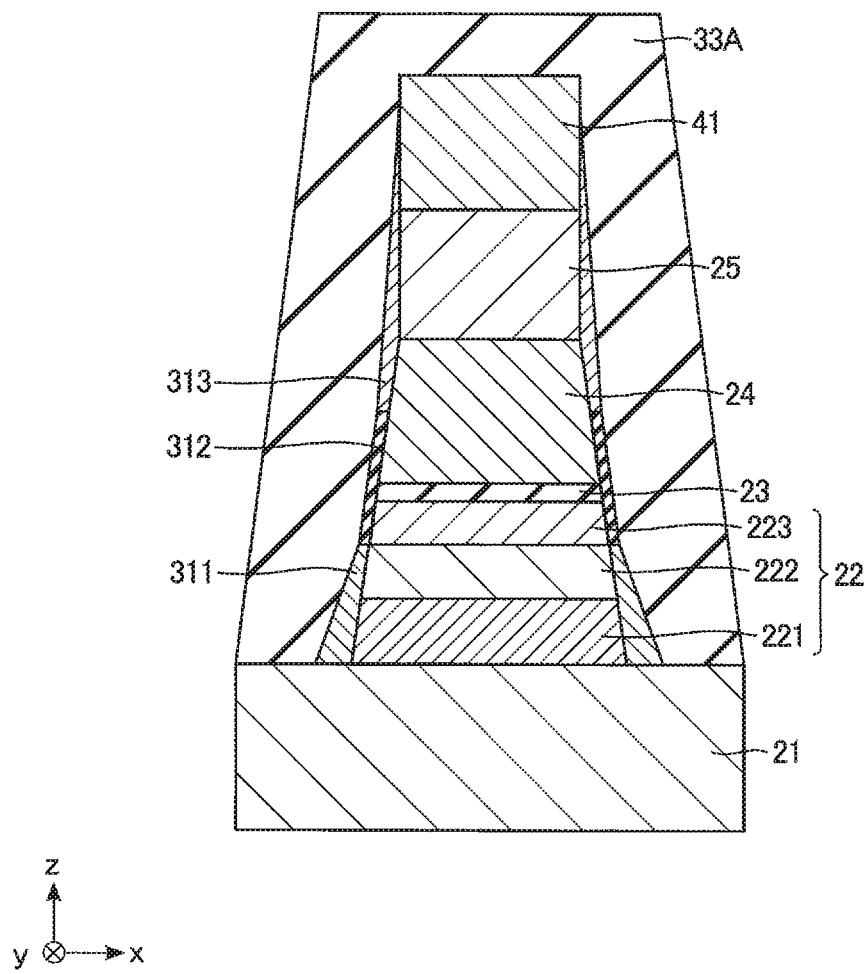

As shown in FIG. 8, an insulator 33A is deposited on the entire surface of the structure obtained by the process described so far. The insulator 33A is a layer to be formed into the insulator 33, and includes the same materials as those included in the insulator 33. The insulator 33A covers the upper part of the side surface and the upper surface of the hard mask 41, the conductor 313, the insulator 312, and the conductor 311. The side surfaces of the upper electrode 25, ferromagnet 24, insulator 23, ferromagnet 223, conductor 222, and conductor 221 are covered with the conductor 313, the insulator 312, and the conductor 311. Therefore, the damage that may be caused by deposition of the insulator 33A is inhibited from extending to the upper electrode 25, the ferromagnet 24, the insulator 23, the ferromagnet 223, the conductor 222, and the conductor 221. Such damage includes, for example, damage caused by plasma when the insulator 33A is deposited by chemical vapor deposition (CVD) in a plasma atmosphere.

Thereafter, a portion of the insulator 33A that is on the upper surface of the hard mask 41, for example, is removed. As a result, the structure shown in FIG. 3 is formed.

<1.3. Advantages (Advantageous Effects)>

According to the first embodiment, a magnetoresistive memory device 1 that includes a high-performance memory cell MC can be provided, as will be described below.

The performance of the memory cell MC may degrade due to the three factors described below.

The first factor is poor exhibition of a magnetoresistive effect due to unintended formation of a conductive path. As described above, the structure shown in FIG. 3 may be formed by the IBE due to various reasons, such as the materials included in the structure, and the ion beam of the IBE may have an angle with respect to the z-axis. Such an IBE causes a material that has been removed from an etching target to be easily redeposited on the structure in the middle of manufacturing. If a conductor that provides a current path ranging to the ferromagnet 24 and the ferromagnet 22 is formed on the side surface of the insulator 23 by the redeposition, a magnetoresistive effect element VR with such a current path cannot exhibit an intended magnetoresistive effect.

According to the first embodiment, the insulator 312 is formed on the side surface of the insulator 23 after the insulator 23 is formed. Since the insulator 312 ranges to the side surface of the ferromagnet 24 and the side surface of the ferromagnet 22, the insulator 312 fully covers the side surface of the insulator 23. Therefore, even if redeposition occurs due to the IBE after the formation of the insulator 23, formation of a current path connecting the ferromagnet 24 and the ferromagnet 22 by bypassing the insulator 23 can be suppressed or prevented.

The second factor is parasitic resistance at an interface between the magnetoresistive effect element VR and the upper electrode 25, and/or an interface between the magnetoresistive effect element VR and the lower electrode 21. The parasitic resistance at these interfaces decreases a current flowing through the magnetoresistive effect element VR, as compared to the case where there is no parasitic resistance. The decrease in the current may degrade the performance of the magnetoresistive memory device 1.

According to the first embodiment, the conductor 311 and the conductor 313 are provided. The conductor 311 functions as a current path connecting the lower electrode 21 and the ferromagnet 22, and the conductor 313 functions as a current path connecting the ferromagnet 22 and the upper electrode 25. With these current paths, the resistance between the lower electrode 21 and the ferromagnet 22 and the resistance between the ferromagnet 24 and the upper electrode 25 are lower than the resistance without these current paths. Therefore, the current flowing through the magnetoresistive effect element VR is large.

The third factor is damage to the magnetoresistive effect element VR. After the magnetoresistive effect element VR is formed, the magnetoresistive effect element VR may be exposed to a plasma atmosphere. For example, the insulator 33 is formed in a plasma atmosphere. Plasma may cause damage to an object. If the insulator 33 is formed directly on the side surface of the magnetoresistive effect element VR, the side surface of the magnetoresistive effect element VR is exposed when the magnetoresistive effect element VR is subjected to a plasma atmosphere. Said exposed portion may be damaged by the plasma. The damage may degrade the magnetic properties of the magnetoresistive effect element VR.

According to the first embodiment, the side surface of the magnetoresistive effect element VR is covered with the protective film 31 before the insulator 33 is formed. When the magnetoresistive effect element VR is exposed to a plasma atmosphere after the magnetoresistive effect element VR is formed, the protective film 31 protects the magnetoresistive effect element VR from the plasma. Said protection can suppress degradation of the magnetic properties of the magnetoresistive effect element VR due to the damage caused by the plasma to the magnetoresistive effect element VR that has already been formed.

Second Embodiment

A second embodiment differs from the first embodiment in terms of the structure of the memory cell MC, and in particular, the details of the structure of the protective film 31. The description of the second embodiment below will focus mainly on the matters different from the first embodiment. For other features of a magnetoresistive memory device 1 of the second embodiment, those of the magnetoresistive memory device 1 of the first embodiment applies.

<2.1. Structure (Configuration)>

FIG. 9 shows a partial cross-sectional structure of a memory cell MC of the second embodiment, and in particular, a cross-sectional structure of a magnetoresistive effect element VR and elements therearound. The memory cell MC of the second embodiment may be referred to as a "memory cell MCa" to be distinguished from the memory cell MC of the first embodiment. As in the first embodiment, the memory cell MCa includes the conductor 311, the insulator 312, and the conductor 313, as well as the protective film 31 that covers the side surface of the magnetoresistive effect element VR. The protective film 31, the insulator 312, and the conductor 313 of the second embodiment may be referred to as a "protective film 31a," an "insulator 312a," and a "conductor 313a," respectively, to be distinguished from those of the first embodiment.

As shown in FIG. 9, the insulator 312a, like the insulator 312, covers the upper part of the side surface of the ferromagnet 22, the side surface of the insulator 23, and the lower part of the side surface of the ferromagnet 24. The insulator 312a includes a portion that covers the side surface of the conductor 311, in addition to the portion that covers the upper part of the side surface of the ferromagnet 22, the side surface of the insulator 23, and the lower part of the side surface of the ferromagnet 24.

The conductor 313a, like the conductor 313, covers the upper part of the side surface of the ferromagnet 24 and the side surface of the upper electrode 25. The side surface of the conductor 311 is covered with the insulator 312a; therefore, the insulator 33 covers the side surface of the insulator 312a and the side surface of only the conductor 313a, instead of covering the side surfaces of the conductor 311, insulator 312a, and conductor 313a as in the first embodiment.

<2.2. Manufacturing Method>

FIGS. 10 to 17 respectively show a state of a manufacturing process of a partial structure of the memory cell MC of the second embodiment in order, showing the same portion as that shown in FIG. 9.

As shown in FIG. 10, the magnetoresistive effect element VR and the conductor 25A are formed. The conductor 25A is a layer formed into the upper electrode 25 in a later step, and is thicker than the upper electrode 25. The structure shown in FIG. 10 can be formed by any method. The structure shown in FIG. 10 can be formed by, for example, stacking a material to be formed into the magnetoresistive effect element VR and a material formed into the conductor 25A in the mentioned order, and etching these materials by IBE using a mask (not shown).

Figure 11:
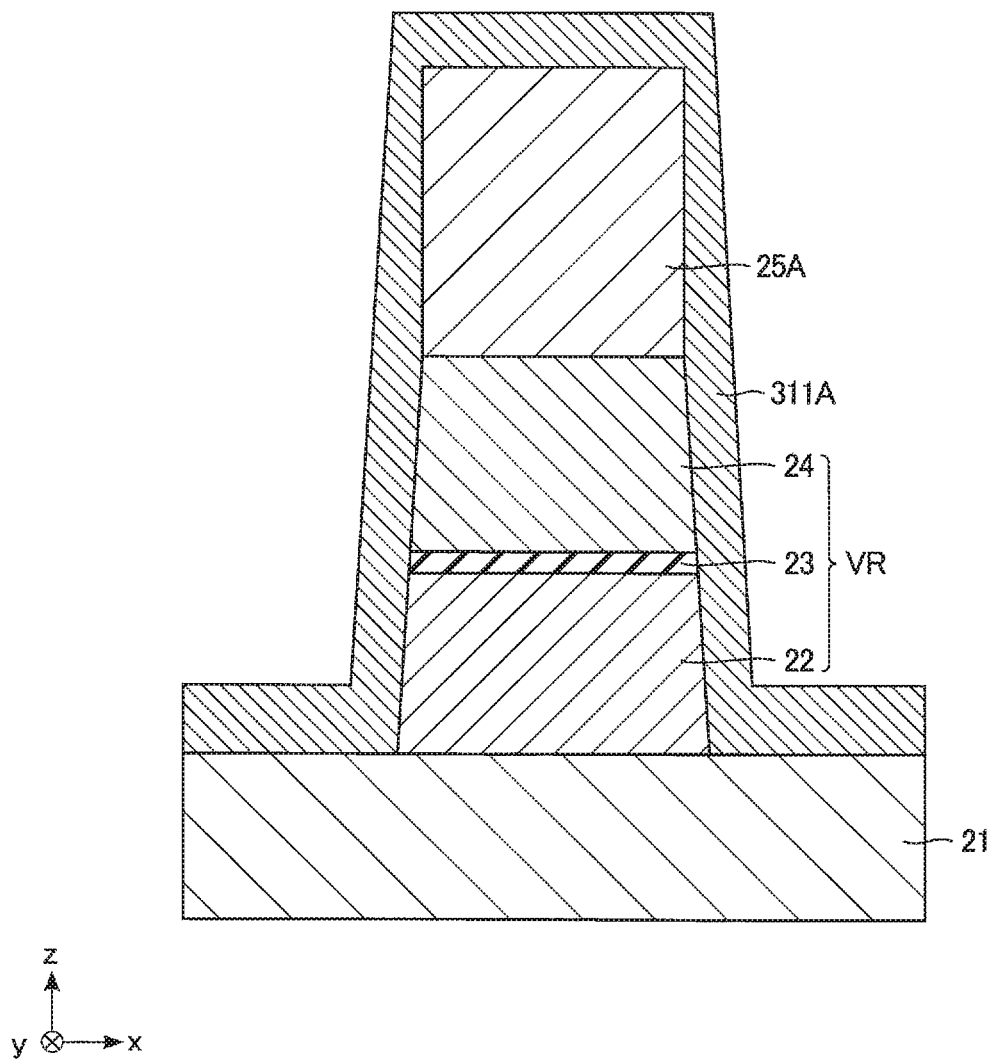

As shown in FIG. 11, a conductor 311A is stacked on the entire surface of the structure obtained by the process described so far. The conductor 311A is a layer to be formed into the conductor 311 in a later step, and includes the same materials as those included in the conductor 311. The conductor 311A covers the exposed part of the upper surface of the lower electrode 21, the side surface of the magnetoresistive effect element VR, and the upper surface and the side surface of the upper electrode 25.

Figure 12:
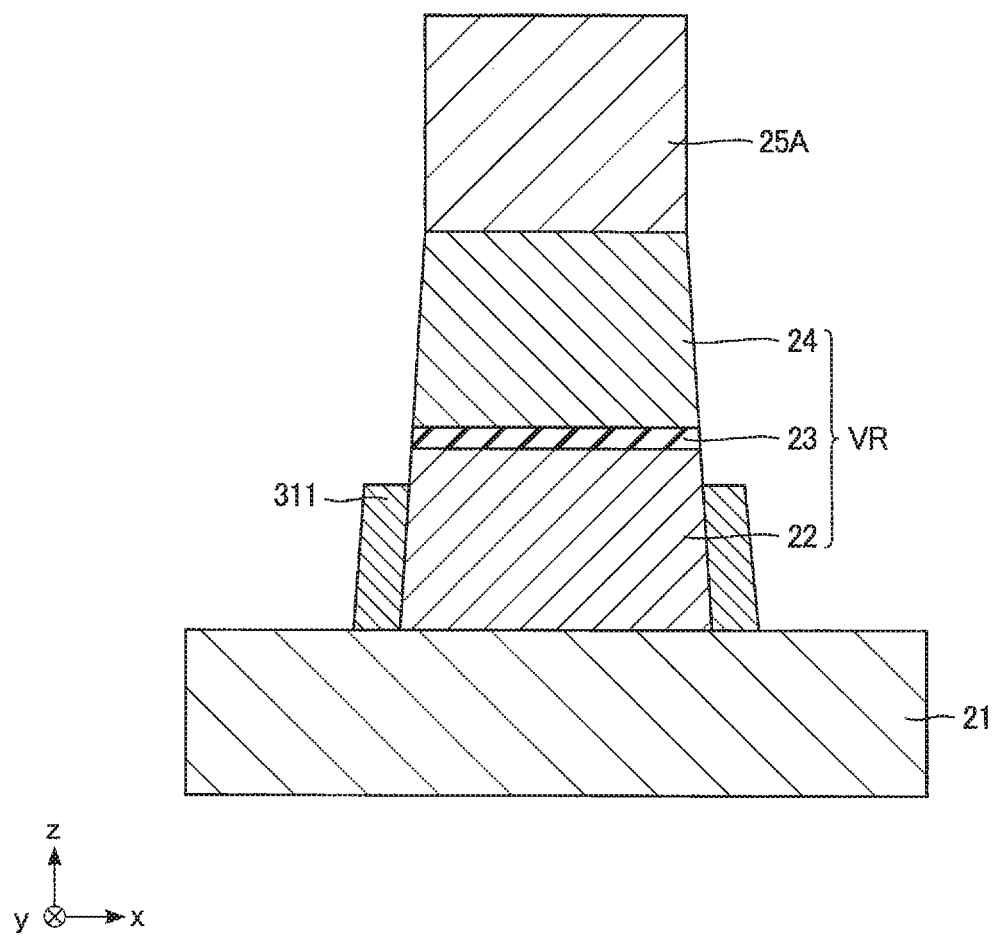

As shown in FIG. 12, the conductor 311A is etched back and formed into the conductor 311. Namely, the conductor 311A is removed by the etch-back processing, excluding the part covering the lower part of the side surface of the ferromagnet 22. The etch-back processing can be performed by IBE, for example. Through the etch-back processing, the upper surface of the conductor 25A is lowered.

As shown in FIG. 13, an insulator 312aA is deposited on the entire surface of the structure obtained by the process described so far. The insulator 312aA is a layer to be formed into the insulator 312a in the subsequent step, and includes the same materials as those included in the insulator 312a. The insulator 312aA covers the exposed part of the upper surface of the lower electrode 21, the exposed part of the side surface of the magnetoresistive effect element VR, and the upper surface and the side surface of the conductor 25A.

Figure 14:
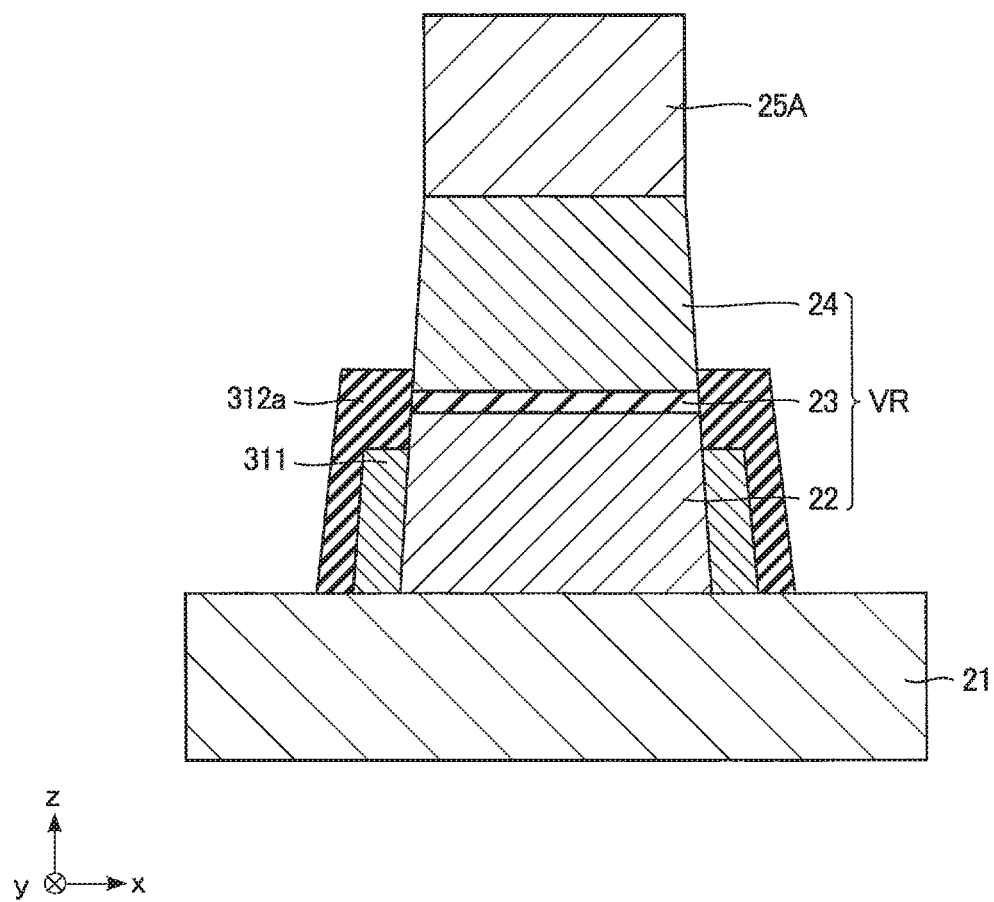

As shown in FIG. 14, the insulator 312aA is etched back to be formed into the insulator 312a. Namely, the insulator 312aA is removed by the etch-back processing, excluding the part covering the side surface of the conductor 311, the upper part of the side surface of the ferromagnet 22, the side surface of the insulator 23, and the lower part of the side surface of the ferromagnet 24. The etch-back processing can be performed by IBE, for example. Through the etch-back processing, the upper surface of the conductor 25A is lowered.

Figure 15:
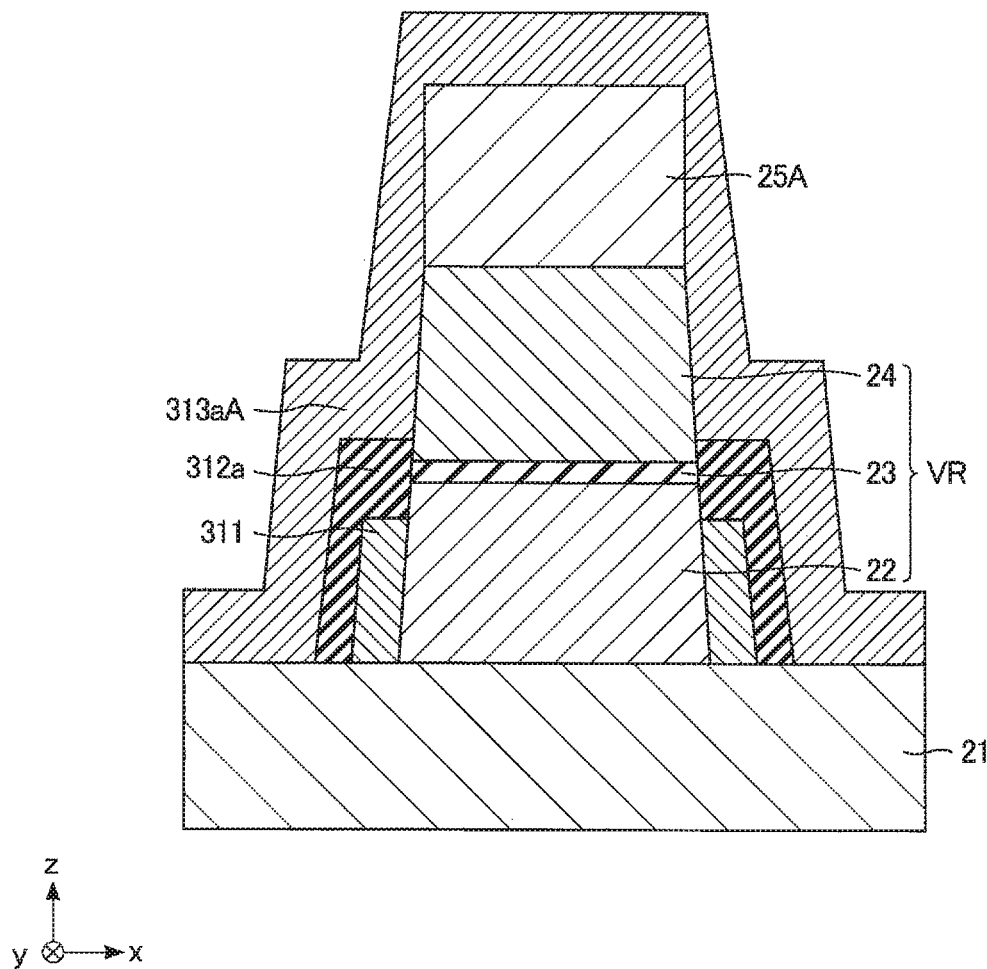

As shown in FIG. 15, a conductor 313aA is deposited on the entire surface of the structure obtained by the process described so far. The conductor 313aA is formed into the conductor 313a in the subsequent step, and includes the same materials as those included in the conductor 313a. The conductor 313aA covers the exposed part of the upper surface of the lower electrode 21, the side surface of the insulator 312a, the exposed part of the side surface of the magnetoresistive effect element VR, and the upper surface and the side surface of the conductor 25A.

Figure 16:
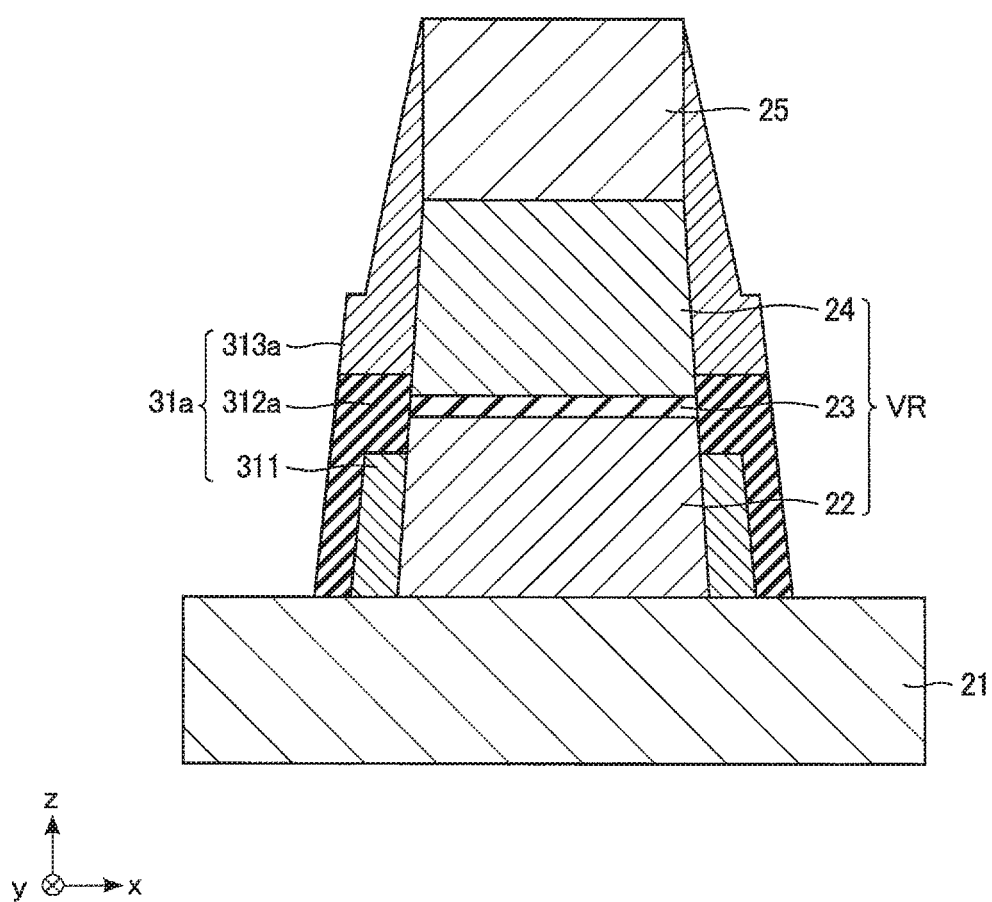

As shown in FIG. 16, the conductor 313aA is etched back to be formed into the conductor 313a. Namely, the conductor 313aA is removed by the etch-back processing, excluding the part covering the upper part of the side surface of the ferromagnet 24 and the side surface of the conductor 25A. The conductor 313aA may remain on the side surface of the insulator 312a as long as the conductor 313aA is not in contact with the lower electrode 21. The etch-back processing can be performed by IBE, for example. Through the etch-back processing, the upper surface of the conductor 25A is lowered, and the conductor 25A is formed into the upper electrode 25. Through the steps up to that shown in FIG. 16, the structure in which the side surfaces of the ferromagnet 24, the insulator 23, and the ferromagnet 22 are covered with the conductor 313a, the insulator 312a, and the conductor 311 is formed.

Figure 17:
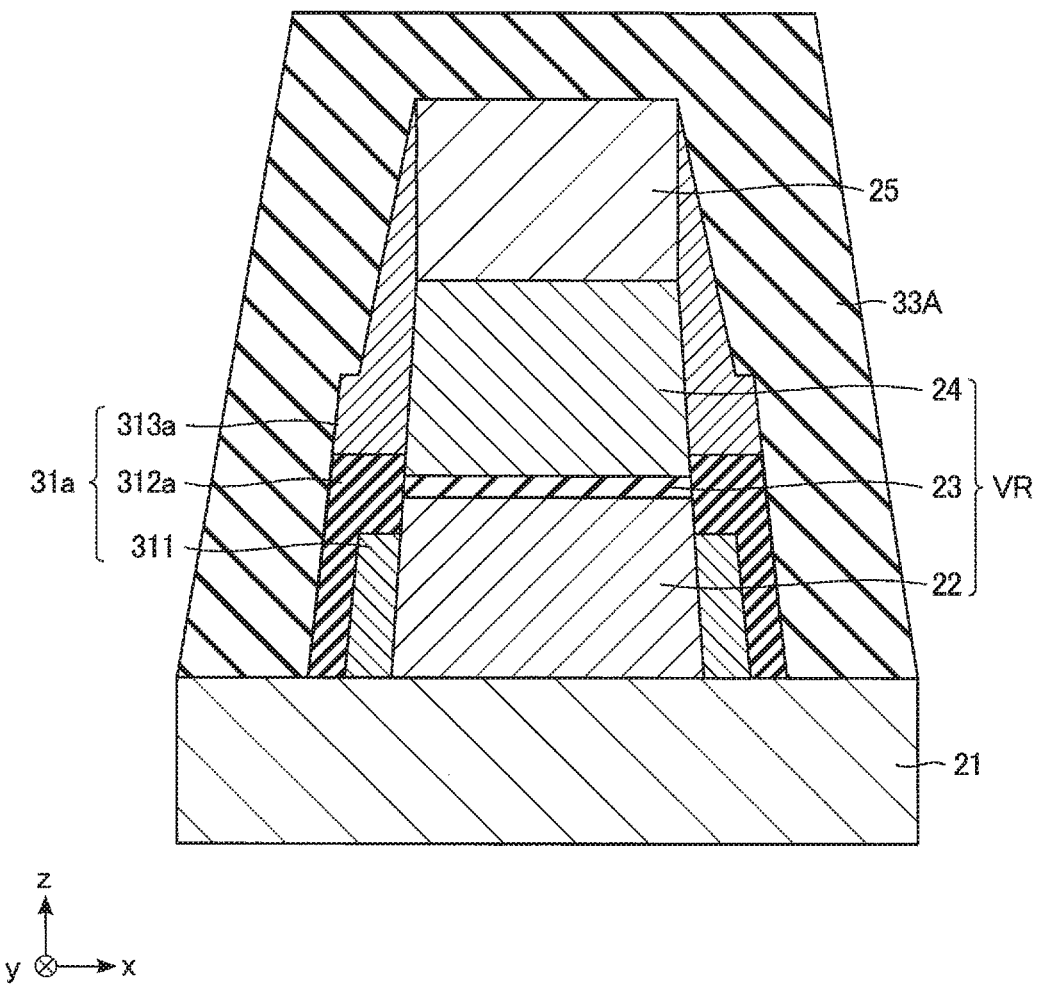

As shown in FIG. 17, the insulator 33A is deposited on the entire surface of the structure obtained by the process described so far, in the same manner as shown in FIG. 8. Thereafter, a portion of the insulator 33A that is on the upper surface of the hard mask 41, for example, is removed. As a result, the structure shown in FIG. 9 is formed.

<2.3. Advantages (Advantageous Effects)>

According to the second embodiment, the conductor 311, the insulator 312a, and the conductor 313a are formed on the side surface of the magnetoresistive effect element VR and the side surface of the upper electrode 25, as in the first embodiment. Therefore, the second embodiment produces the same advantages as those produced by the first embodiment.

<3. Modification>

The descriptions provided so far relate to the example in which the ferromagnet 22 is positioned below the insulator 23 and the ferromagnet 24 is positioned above the insulator 23. The embodiments are not limited to said example. The ferromagnet 22 may be positioned above the insulator 23, and the ferromagnet 24 may be positioned below the insulator 23.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device comprising:
    a first conductor with a first surface;
    a first structure on the first surface of the first conductor, the first structure including a first ferromagnetic layer;
    an insulating layer on the first structure;
    a second structure on the insulating layer, the second structure including a second ferromagnetic layer;
    a second conductor in contact with the first surface of the first conductor and a side surface of the first structure;
    a first insulator on the second conductor, the first insulator covering a side surface of the insulating layer, the first insulator being in contact with the side surface of the first structure and a side surface of the second structure; and
    a third conductor on the first insulator and in contact with the side surface of the second structure.

2. The magnetoresistive memory device according to claim 1, further comprising a fourth conductor on the second structure,
    wherein the third conductor is further in contact with a side surface of the fourth conductor.

3. The magnetoresistive memory device according to claim 1, wherein a set of the second conductor, the first insulator, and the third conductor further covers a set of the side surface of the first structure and the side surface of the second structure.

4. The magnetoresistive memory device according to claim 3, further comprising a second insulator that covers a side surface of the second conductor, a side surface of the first insulator, and a side surface of the third conductor.

5. The magnetoresistive memory device according to claim 1, wherein the second conductor includes an element having electrical conductivity in an oxidized state.

6. The magnetoresistive memory device according to claim 1, wherein the second conductor includes one or more selected from Fe, Co, Ni, Cu, Ru, Rh, Pd, Ta, W, Ir, and Pt.

7. The magnetoresistive memory device according to claim 1, wherein the first insulator comprises a material different from that of the insulating layer.

8. The magnetoresistive memory device according to claim 1, wherein the first insulator includes a conductive element that becomes insulative when oxidized.

9. The magnetoresistive memory device according to claim 1, wherein the first insulator includes one or more selected from Mg, Si, Al, Sc, Y, Hf, and Nd.

* * * * *